United States Patent [19]
Worm et al.

[11] Patent Number: 5,682,259
[45] Date of Patent: Oct. 28, 1997

[54] BUS POWERED MANUALLY ACTUATABLE INTEGRATED PILOT LIGHT/CONTACT/COMMUNICATIONS MODULE

[75] Inventors: Steven L. Worm, Raleigh; Jackie C. Sullivan, Knightdale, both of N.C.

[73] Assignee: Square D Company, Palatine, Ill.

[21] Appl. No.: 619,865

[22] Filed: Mar. 19, 1996

[51] Int. Cl.$^6$ ............................. H04B 10/00; H02B 1/24
[52] U.S. Cl. ................... 359/163; 359/135; 455/90; 307/117; 307/119; 307/125; 361/718; 340/815.48; 340/815.5; 340/815.74
[58] Field of Search ........................ 359/135, 139, 359/144, 163; 455/90; 307/117, 119, 125; 361/718, 719–720, 722; 200/16 A, 238; 340/815.48, 815.49, 815.5, 815.74

[56] References Cited

U.S. PATENT DOCUMENTS

| | | | |
|---|---|---|---|
| 4,463,398 | 7/1984 | Boozer et al. | 340/815.5 |
| 4,808,994 | 2/1989 | Riley | 340/825.57 |
| 5,525,846 | 6/1996 | Newell et al. | 307/125 |

*Primary Examiner*—Kinfe-Michael Negash
*Attorney, Agent, or Firm*—David R. Stacey; Larry T. Shrout

[57] ABSTRACT

A manually actuatable integrated pilot light/contact/communications module connecting to an associated output device also having a communications module by means of a common communications link. The integrated pilot light/contact/communications module has at least one electrical contact, a logic circuit, a communications circuit, a communications terminal and pilot light activation circuit mounted on a printed circuit board. A bulb base for a pilot light is mounted on the module enclosure and electrically connected to the printed circuit board. The printed circuit board provides communication between the electrical contact and the logic circuit, between the logic circuit and the communications circuit, between the communications circuit and the communications terminal, between the communications circuit and the pilot light activation circuit, and between the pilot light activation circuit and the pilot light. The printed circuit board is enclosed within the module housing. A translation pin is partially enclosed within the housing and movable between a first position and a second position. An operator interface device is attached to the integrated pilot light/contact/communications module such the operator interface device is in communication with that portion of the translation pin outside the protective housing.

20 Claims, 4 Drawing Sheets

BUS POWERED MANUALLY ACTUATABLE INTEGRATED PILOT LIGHT/CONTACT/ COMMUNICATIONS MODULE

FIELD OF THE INVENTION

This invention relates to automation and control devices and particularly to bus powered pilot light modules, contact modules and communication modules employing a shared communication link to activate an output device and the pilot light.

BACKGROUND OF THE INVENTION

Systems for remotely controlling electrical devices from a manual control panel are well known. In some systems employing point-to-point input/output, or I/O, architecture, each of a plurality of manually activated operator interface devices, such as a push button, a key operator, a joy stick, or a rotary selector may be used to operate an associated contact block having one or more electrical contacts. Each contact block is electrically connected to an associated remotely located output device, such as a pilot light, a contractor, an overload relay or other electrically controllable device. These individual point-to-point connections between each contact block and its associated output device causes the task of making a manual control panel assembly extremely labor intensive and costly.

In order to reduce the labor costs as well as the cost of materials, it is now known to construct manual control panel assemblies wherein a number of operator interface controlled contact blocks are connected to a number of remotely located output devices by a single time division multiplexing communications link shared by all of the input and output modules of the system. In this system each contact block is electrically connected to an associated input access module which provides access to the multiplexing communications link over which the status of that particular contact block is conveyed to an associated output access control module. The output access control module is electrically connected to an associated output device which is ultimately controlled by the associated operator interface device at the control panel. This mode of operation is herein defined as the STAND-ALONE-MODE or PEER-TO-PEER mode where one contact block and its associated input access module sends a signal directly to its associated output access module for controlling the associated output device. This system could also be used in a HOST mode where the signal from the input access module is sent to a computer or other device having a CPU or means for adding simple logic functions such as AND, NAND, OR or NOR to the signal. A control system employing a time division multiplex common communication link is shown and described in U.S. Pat. No. 4,808,994 issued on Feb. 28, 1989 to Riley for "Logic Interchange System" and in the improvement patent application Ser. No. 08/099,788 filed Jul. 30, 1993 now U.S. Pat. No. 5,555,267 assigned to the assignee of the present invention and incorporated herein by reference. In this type of system, both the input and output access modules contain a communications circuit for communicating on the time division multiplexed common communications link and a circuit for implementing basic logic functions such as AND, NAND, OR and NOR. Because the logic circuit is included in each of the input and output access modules the system can operate in either the STAND-ALONE-MODE or the HOST mode. The state of the contact block is received by the input access module where it is processed and passed onto the communications link in the proper time slot to be received by the associated output access module. The output access module interprets the signal and passes the appropriate signal on to the output device for action.

It is also known to convey contact block status information between a number of input access modules and their associated output access modules via network signaling. An example of such a network signaling control system is the LonWorks system which is assembled from components manufactured by Echelon Company of Palo Alto, Calif. The LonWorks system also comprises an ASIC which produces the signals for the network and may also be programmed with software to produce the basic logic functions of AND, NAND, OR and NOR.

The use of either of these two types of distributed I/O architecture will eliminate the point-to-point wiring between each contact block and its associated output device. However, in the current state of the art, a point-to-point connection is still required between the contact block and some type of input access module associated with the contact block and between the output device and some type of output access module associated with the output device. Each connection between an access module and a contact block or output device requires at least two separate wires and sometimes more. In control panel construction the operator interface device is installed on the outside of the panel cover and the contact block is on the inside of the panel cover. The operator interface device and contact block are in communication with each other such that manually operating the operator interface device will change the state of the electrical contacts within the contact block. The input access module is generally placed at an easily accessible location inside the control panel such as the back wall of the panel enclosure. This is usually some distance away from the contact block. It is also common for a control panel to include a number of pilot lights, each indicating the status of an associated output device controlled by its associated operator interface device. These pilot lights are actually output devices and therefore require a connection to the common communications link. Each pilot light requires a separate output access module and wiring between the output access module and the pilot light. The wiring between the contact blocks, pilot lights and their associated input and output access module must be of sufficient length to permit cover removal when inspection, maintenance or trouble shooting is required. This generally requires several feet of wire for each connection. Control panels which have a large number of operator interface devices and pilot lights are difficult to wire and assemble due to the many wires required. Thus, even with the common communication link between input access modules and output access modules the control panel itself still requires considerable wiring time and material. The physical size of the control panel enclosure is also a consideration. For each contact block and pilot light in the control panel, one input or output access module is required. The input and output access modules are at least the same size as the contact blocks and pilot lights and in many cases much larger. Therefore the volume of the control panel must be of sufficient size to enclose all of the input and output access modules and the wire required for connecting them to their respective contact blocks and pilot lights. In U.S. patent application Ser. No. 08/282,839, Docket No. RLC-4, filed on Aug. 27, 1994, now U.S. Pat. No. 5,525,846 assigned to the present assignee and incorporated herein by reference, this was simplified by incorporating the logic and communications circuits of the input module and output module into the contact module and pilot light module. However, this still required the assembly and wiring of two modules, one pilot light module and at least one contact module, to produce an illuminated switch (see FIG. 1).

SUMMARY OF THE INVENTION

It is an objective of this invention to provide an integrated pilot light/contact/communications module which will greatly reduces the labor intensive wiring and assembly problems associated with control panels employing conventional contact blocks, pilot light assemblies, input access modules and output access modules, while, at the same time, making trouble shooting and maintenance of the control panel easier.

It is also an object of this invention to reduce the number of electrical circuits required for the system by approximately one half thus permitting the complete integrated pilot light/contact/communications module to be approximately the same size as a pilot light module of the previous systems. This objective will permit the integrated pilot light/contact/communications modules to be used with existing devices and as direct replacement for existing devices without requiring additional labor and components.

The objects of the invention are achieved by providing a manually actuatable integrated pilot light/contact/communications module comprising a housing; a printed circuit board enclosed within the housing; at least one electrical contact selectively movable between an open state and a closed state and electrically connected to the printed circuit board, means for manually changing the state of the contact, the means being partially enclosed within the housing; a logic circuit in electrical communication with the contact for providing a logical function in response to the change of state of the contact; a communications circuit in electrical communication with the logic circuit for producing a signal in response to the logic circuit; a communications terminal in electrical communication with the communications circuit for providing an external connection to a bi-directional communications link; a pilot light activation circuit located on the printed circuit board; a pilot light mounted to the housing and in electrical communication with the pilot light activation circuit; means for attaching the integrated contact module to an operator interface device; and status indicating LED's visible from the rear of the module housing.

It is also preferable that the integrated pilot light/contact/communications module include a second contact having a normal state opposite that of the first contact and that the second contact be in electrical communication with a second logic circuit which in turn is in electrical communication with the communications circuit which provides a signal in response to the state of the second contact to the communications terminal.

The integrated pilot light/contact/communications module of the present invention further includes a group of status indicating LED's viewable from the rear of the of the module. These LED' indicate "POWER ON", status of a first electrical contact, status of a second electrical contact and status of the pilot light. This facilitates trouble shooting of a control panel by allowing the repair person to easily see the status of each operator interface device and output device from the rear of the control panel.

Other features and advantages of the invention will become apparent to those skilled in the art upon review of the following detailed description, claims and drawings.

Figure 1:
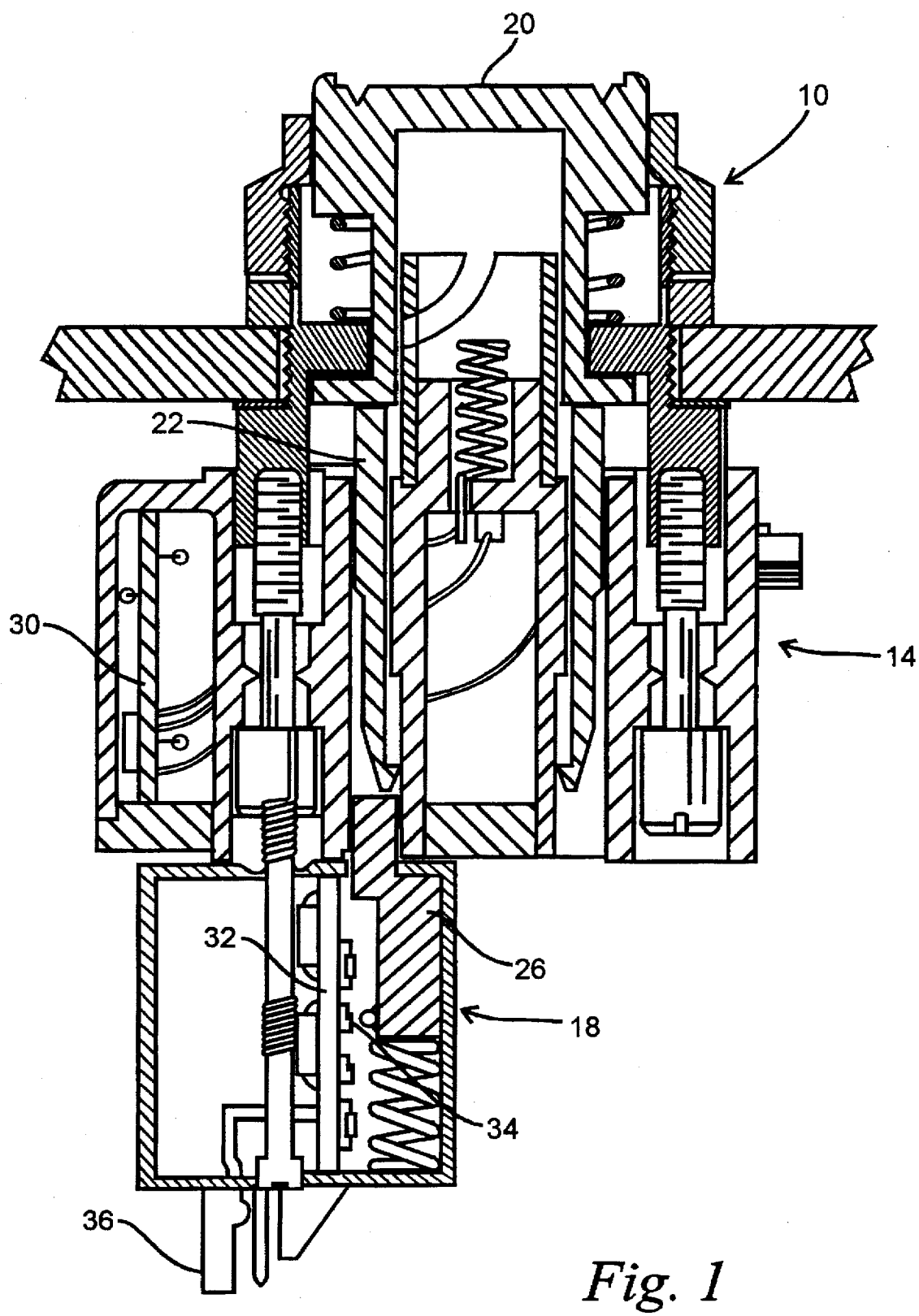
FIG. 1 is a cross-sectional view of a push button operator having a pilot light module and a switch/communications module attached.

Before one embodiment of the invention is explained in detail, it is to be understood that the invention is not limited in its application to the details of construction and description or illustrated in the drawings. The invention is capable of other embodiments and of being practiced or being carried out in various other ways. Also, it is to be understood that the phraseology and terminology used herein is for the purpose of description and should not be regarded as limiting.

DESCRIPTION OF THE PREFERRED EMBODIMENT

Referring to FIG. 1, an operator interface 10 (push button), integrated pilot light module 14 and integrated contact block 18 as described in U.S. patent application Ser. No. 08/282,839 are illustrated. The pilot light module 14 is connected directly to the operator interface device 10 thus permitting the pilot light to be seen through a lens 20 in the operator interface 10. The integrated contact module 18 is attached to the back side of the integrated pilot light module 14 such that translation pins 22 in the pilot light module 14 can transfer the movement of the operator interface 10 to a contact operator 26 in the integrated contact module 18. The integrated pilot light module 14 includes a printed circuit board 30 on which a logic circuit, a communications circuit and a pilot light activation circuit for activating the pilot light are located. The integrated contact module is includes a printed circuit board 32 on which a logic circuit, a communications circuit and at least one contact 34 are located. The contact 34 changes state as the contact operator 26 moves in response to movement of translation pin 22 initiated by the operator interface device 10. A communications terminal 36 is attached to both boards 30 and 32 (not shown on board 30) for connecting to a bi-directional communications link.

Figure 2:
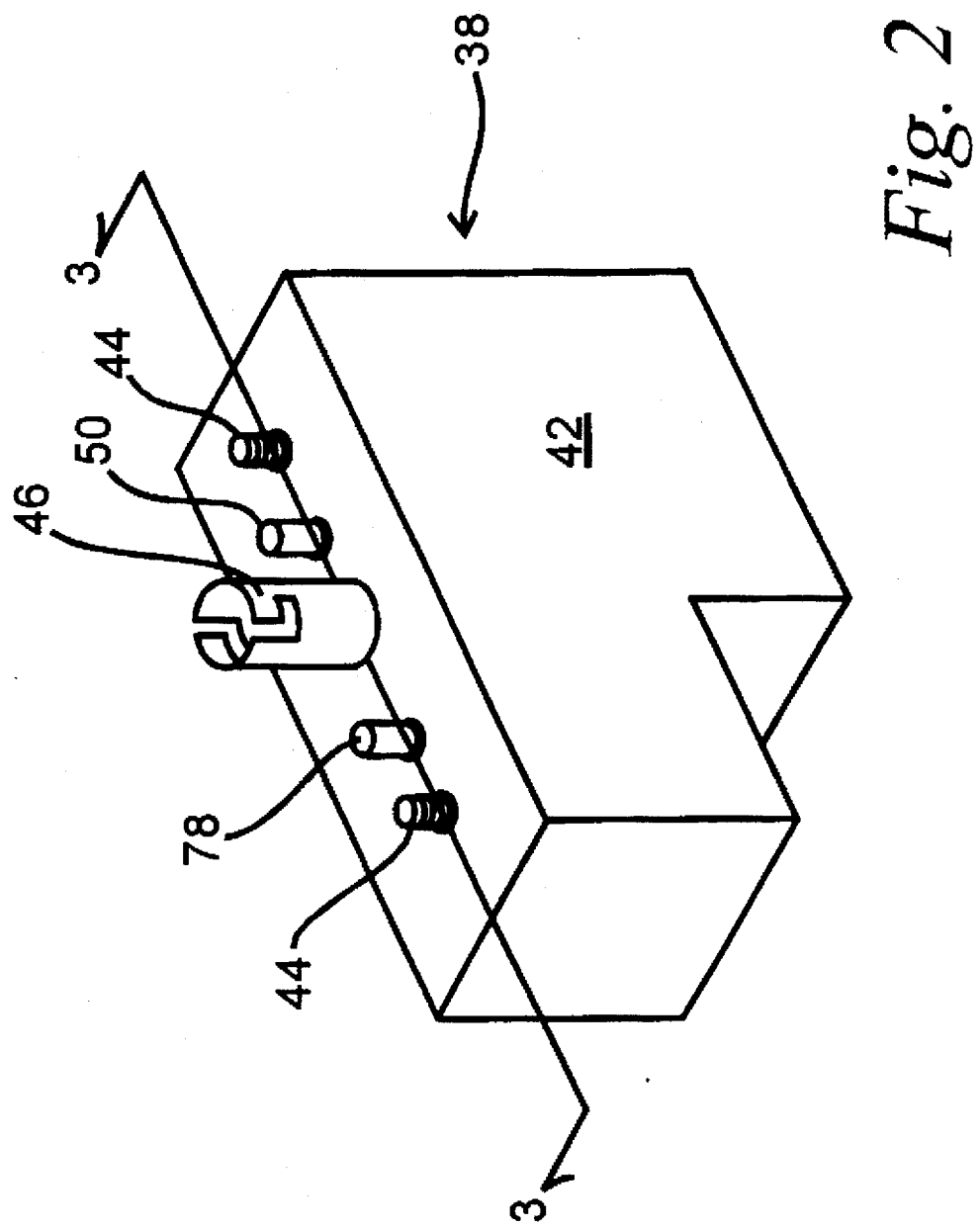
FIG. 2 is an isometric of an integrated pilot light/contact/communications module in accordance with the present invention.

FIG. 2 illustrates the manually actuatable integrated pilot light/contact/communications module of the present invention, generally indicated by the reference numeral 38. The integrated module 38 includes a generally rectangular housing 42 which is provided with screws 44 for attaching to an operator interface 10 of FIG. 1. A bulb base 46 for receiving an illuminating device such as an incandescent bulb or LED cluster is attached to the housing 42. At least one translation pin 50 is provided. The translation pin 50 has a first end 51 located inside the housing an a second end 52 located outside the housing 42 for interaction with the operator interface device 10. The second end 52 can be used to translate movement of an operator interface device (not shown) to a contact block (not shown) through an aperture 53 located in the back of the housing 42. An auxiliary integrated contact module is may be used in place of the contact block if a second network is monitoring the operator interface device 10. These auxiliary contacts are attached to the back of the housing 42. In other pilot light modules such as pilot light module 14 of FIG. 1, the translation pins 22 are loosely maintained within the pilot light module housing and function only as a means for translating movement of the operator interface device 10 through the pilot light module 14 to the integrated contact module 18.

Figure 3:
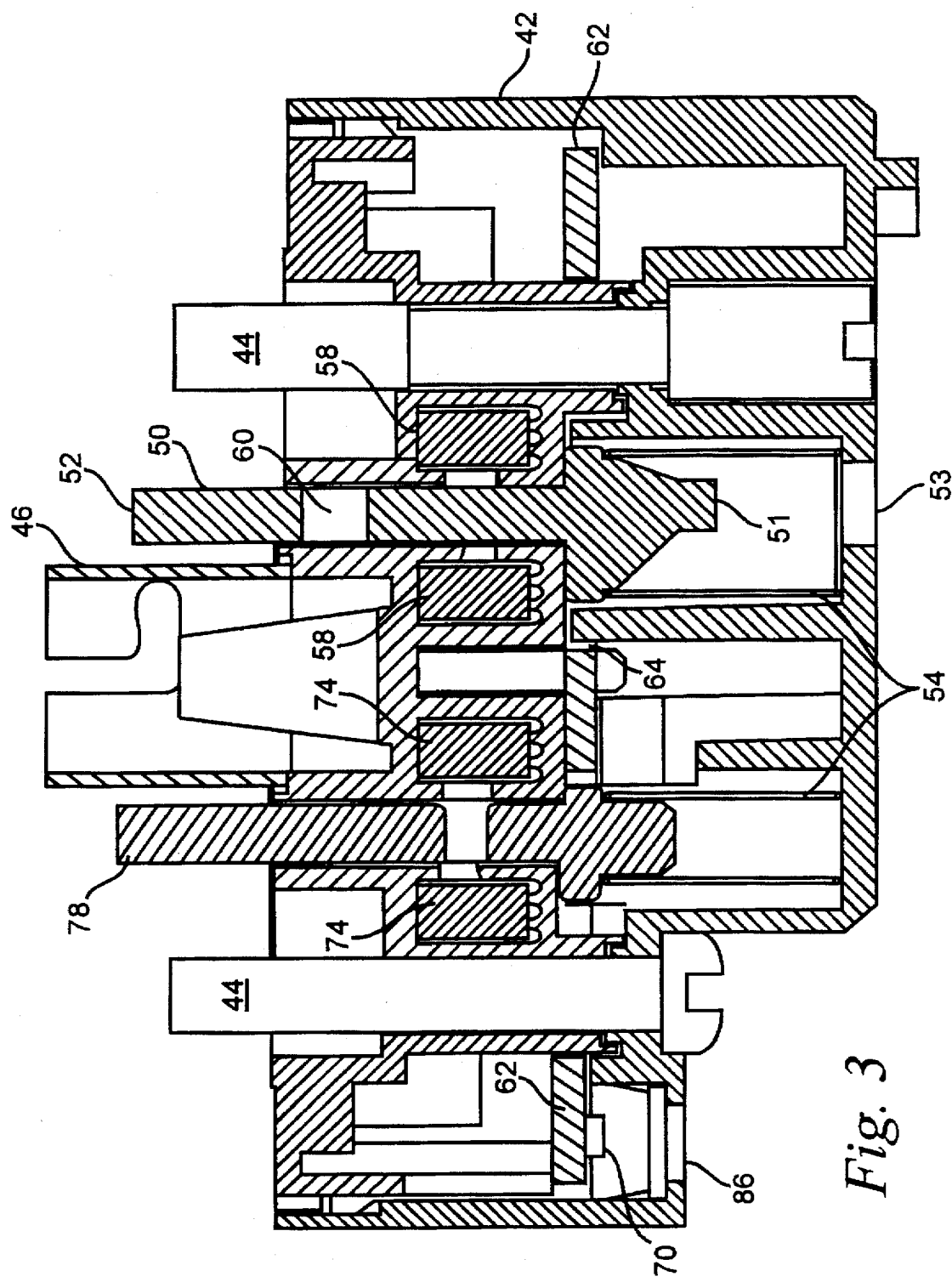
FIG. 3 is a cross-sectional view taken along line 3—3 of FIG. 2 of an integrated pilot light/contact/communications module in accordance with the present invention.

Referring now to FIG. 3, it can be seen that the translation pin 50 of the present invention is biased to a first position by a spring 54 and provides the means for changing the state of a contact 58 located adjacent the translation pin 50. The contact 58 may be a mechanical operated, a magnetically operated or an optically operated switch. In the preferred embodiment the contact 58 is an optical switch and the means for operating it is a window 6 located in the translation pin 50. The window 60 is positioned such that light can be pass through it when the translation pin 50 is in one position and or blocked by the translation pin 50. A printed circuit board 62 is located inside the housing and is positioned such that its flat surface is generally perpendicular to the translation pin 50. The printed circuit board 62 to is provided with an aperture 64 for permitting the translation pin 50 to pass through the printed circuit board 62. Located on the printed circuit board 62 are a logic circuit, a communications circuit, a pilot light activation circuit, a communications terminal 66 (FIG. 4) and a group of status indicating LED's 7. The contact 58 can be located on the printed circuit board 62 or fixed to a portion of the housing structure guiding the translation pin 50. In either case the contact 58 is electrically connected to the logic circuit on the printed circuit board 62. The logic circuit provides a logical function in response to the change of state of the contact 58. The logic circuit is connected to the communications circuit which produces a control signal in response to the logical function. The control signal is passed from the communications circuit to the communications terminal 66 and then to an associated remote output device over a bi-directional communications link. In this application, the term "communication link" is defined as a bus having both communications and power lines. The associated remote output device also includes a module having a logic circuit and a communications circuit which interprets the control signal and produces a signal indicating the state of the associated remote output device. The bulb base 46 is electrically connected to the pilot light activation circuit on the printed circuit board The pilot light activation circuit is connected to the communications circuit such that the status signal from the associated remote output device will determine the "ON" or "OFF" state of the pilot light. Power for operating the pilot light is provided by the communications link. It is desirable for the integrated pilot light/contact/communications module 3S to include a second contact 74 having a normal state opposite the first contact 58. The second contact 74 is operated by a second translation pin 78 and is connected to a second logic circuit located on the printed circuit board 62. Each of the translation pins, 50 and 78, includes means located at a predetermined position on the translation pins, 50 and 78, for activating the contacts 58 and 74. This means can include a nodule or ridge for operating a mechanically operated switch, a magnet for operating a magnetically operated switch or a window for operating an optical switch.

Figure 4:
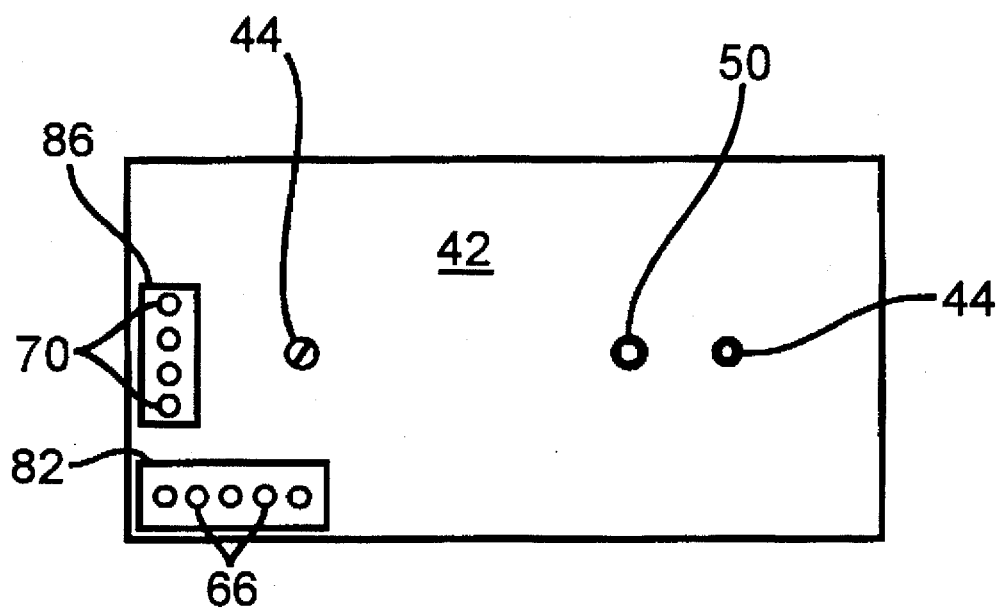
FIG. 4 is a view of the rear of the integrated pilot light/contact/communications module.

Referring now to FIG. 4, The communications terminal 66 is located on the printed circuit board 62 such that it can be accessed through an opening 82 in the back of the housing 42. The status indicating LED's 70 are positioned on the printed circuit board 62 such that can be viewed through an opening 86 in the back of the housing 42. The LED's indicate "POWER ON", status of the first contact 58, status of the second contact 74 and status of the pilot light.

We claim:

1. A manually actuatable integrated pilot light/contact/communications module, comprising:

a housing defining a hollow interior;

at least one translation pin, partially enclosed within said housing and slidably movable between a first position and a second position;

a printed circuit board, mounted within said housing such that said at least one translation pin is generally perpendicular to a generally flat surface of said printed circuit board and passes through an aperture in said printed circuit board;

a first electrical contact located immediately adjacent said at least one translation pin such that movement of said at least one translation pin between said first and second positions will cause a change of state of said first electrical contact, said first electrical contact being in electrical communication with said circuit board;

a first logic circuit located on said circuit board and in communication with said first electrical contact;

a communications circuit located on said circuit board and in electrical communication with said logic circuit;

a communications terminal mounted on said circuit board and in communication with said communications circuit, said communications terminal providing bi-directional access to a common communications link for sending a control signal to an associated remote output device and receiving a signal from said associated remote output device;

a pilot light base for receiving an illuminating device, said pilot light base mounted on said housing and being electrically connected to said circuit board; and a pilot light activation circuit located on said circuit board and in communication with said communications circuit, said pilot light activation circuit receiving a signal from said associated remote output device for determining an ON or OFF state of said pilot light.

2. The integrated pilot light/contact/communications module of claim 1 wherein said communications circuit is of the type providing communications signals for use on a time division multiplexing communications link.

3. The integrated pilot light/contact/communications module of claim 1 wherein said communications circuit is of the type providing communications signals for use on an encoded network communications link.

4. The integrated pilot light/contact/communications module of claim 1 wherein said first electrical contact is a mechanically operated switch.

5. The integrated pilot light/contact/communications module of claim 1 wherein said first electrical contact is a magnetically operated switch.

6. The integrated pilot light/contact/communications module of claim 1 wherein said first electrical contact is an optically operated switch.

7. The integrated pilot light/contact/communications module of claim 1 wherein said printed circuit board further includes a plurality of status indicators for providing a visual indication of POWER ON, said contact status and said illuminating device status.

8. The integrated pilot light/contact/communications module of claim 1 wherein said at least one translation pin further comprises:

a first end enclosed within said housing, said first end is slidably movable in a plane generally perpendicular to said generally flat surface of said printed circuit board;

a second end extending outward from said housing; and means for changing said contact state, said means being located at a predetermined location on said translation pin such that as said translation pin is moved between said first and second positions said contact is changed state from one state to another state.

9. The integrated pilot light/contact/communications module of claim 8 wherein said integrated module includes a second contact electrically connected to a second logic circuit electrically connected to said communications circuit, said second contact being operated by a second translation pin.

10. A manually actuatable integrated pilot light/contact/communications module, comprising:

a housing defining a hollow interior;

at least one translation pin, partially enclosed within said housing said at least one translation pin being biased to a first position and slidably movable to a second position;

a printed circuit board, mounted within said housing such that said at least one translation pin is generally perpendicular to a generally flat surface of said printed circuit board and passes through an aperture in said printed circuit board;

a first electrical contact located immediately adjacent said at least one translation pin such that movement of said at least one translation pin between said first and second positions will cause a change in state of said first electrical contact, said first electrical contact being in electrical communication with said circuit board;

a first logic circuit located on said circuit board and in communication with said first electrical contact such that a logical function may be produced in response to said change of state of said electrical contact;

a communications circuit located on said circuit board and in electrical communication with said logic circuit, said communications circuit producing a control signal in response to said logical function;

a communications terminal mounted on said circuit board and in communication with said communications circuit, said communications terminal providing bi-directional access to a common communications link such that said control signal may be placed on the common communications link for controlling an associated remote output device, said associated remote output device also having means for accessing the common communications link, and for sending a state signal indicating the state of said associated remote output device;

a pilot light having a light base mounted on said housing and electrically connected to said circuit board; and a pilot light activation circuit located on said circuit board, said pilot light activation circuit being in electrical communication with said light base and said communication circuit such that said ON or OFF state of said pilot light is determined by said state signal from said associated remote output device.

11. The integrated pilot light/contact/communications module of claim 10 wherein said communications circuit is of the type providing communications signals for use on a time division multiplexing communications link.

12. The integrated pilot light/contact/communications module of claim 10 wherein said communications circuit is of the type providing communications signals for use on an encoded network communications link.

13. The integrated pilot light/contact/communications module of claim 10 wherein said first electrical contact is a mechanically operated switch.

14. The integrated pilot light/contact/communications module of claim 10 wherein said first electrical contact is a magnetically operated switch.

15. The integrated pilot light/contact/communications module of claim 10 wherein said first electrical contact is an optically operated switch.

16. The integrated pilot light/contact/communications module of claim 10 wherein said printed circuit board further includes a plurality of status indicators for providing a visual indication of POWER ON, contact status and said pilot light status.

17. The integrated pilot light/contact/communications module of claim 10 wherein said at least one translation pin further comprises:

a first end enclosed within said housing, said first end is slidably movable in a plane generally perpendicular to said generally flat surface of said printed circuit board;

a second end extending outward from said housing; and means for changing said contact state, said means being located at a predetermined location on said translation pin such that as said translation pin is moved between said first and second positions said contact is changed state from one state to another state.

18. The integrated pilot light/contact/communications module of claim 17 wherein said integrated module includes a second contact electrically connected to a second logic circuit electrically connected to said communications circuit, said second contact operated by a second translation pin.

19. A manually actuatable integrated pilot light/contact/communications module, comprising:

a housing defining a hollow interior;

at least one translation pin, partially enclosed within said housing and slidably movable between a first position and a second position;

a printed circuit board, mounted within said housing such that said at least one translation pin is generally perpendicular to a generally flat surface of said printed circuit board and passes through an aperture in said printed circuit board;

a first electrical contact located immediately adjacent said at least one translation pin such that movement of said at least one translation pin between said first and second positions will cause a change of state of said first electrical contact, said first electrical contact being in electrical communication with said circuit board;

a first logic circuit located on said circuit board and in communication with said first electrical contact; a communications circuit located on said circuit board and in electrical communication with said logic circuit; a communications terminal mounted on said circuit board and in communication with said communications circuit, said communications terminal providing bi-directional access to a common communications link for sending control signal to an associated remote output device and receiving a signal from said associated remote output device;

a pilot light base for receiving an illuminating device, said pilot light base mounted on said housing and electrically connected to said circuit board;

a pilot light activation circuit located on said circuit board and in communication with said communications circuit, said pilot light activation circuit receiving a signal from said associated remote output device for determining an ON or OFF state of said pilot light, power for said pilot light ON state provided by the communications link; and a plurality of status indicators located on said printed circuit board for indicating POWER ON, the state of said first contact and the state of said illuminating device.

20. The integrated pilot light/contact/communications module of claim 19 wherein said status indicators are LED's.

* * * * *